United States Patent [19]

Jiko et al.

[11] Patent Number: 4,716,378

[45] Date of Patent: Dec. 29, 1987

[54] AMPLIFIER CIRCUIT

[75] Inventors: Hideyasu Jiko, Neyagawa; Tomoyuki Hayashi, Hirakata, both of Japan

[73] Assignee: Matsushita Electric Industrial Co., Ltd., Kadoma, Japan

[21] Appl. No.: 851,527

[22] Filed: Apr. 14, 1986

[30] Foreign Application Priority Data

Apr. 15, 1985 [JP] Japan .................................. 60-79602

[51] Int. Cl.⁴ .............................................. H03F 1/34
[52] U.S. Cl. ..................................... 330/108; 330/146
[58] Field of Search ................. 330/108, 75, 146, 260; 381/120, 121

[56] References Cited

U.S. PATENT DOCUMENTS 4,283,683 8/1981 Main ............................... 330/146 X

OTHER PUBLICATIONS

Walker et al, "Current Dumping Audio Amplifier", Wireless World, Dec. 1975, pp. 560–562.

Primary Examiner—James B. Mullins
Attorney, Agent, or Firm—Wenderoth, Lind & Ponack

[57] ABSTRACT

An amplifier circuit for use, e.g., in audio appliances, comprises two amplifiers; a first amplifier for controlling the output voltage, and a second amplifier for driving output electric current. An impedance circuit is connected to both outputs of the first and second amplifiers. Thus, the amplifier circuit accurately controls output electric power in response to the input signal and yet providing sufficient electric current for driving a speaker.

6 Claims, 3 Drawing Figures

AMPLIFIER CIRCUIT

BACKGROUND OF THE INVENTION

1. Field of the Invention

The invention relates to an amplifier circuit for use, e.g., in audio appliances and, more particularly, to an improved amplifier circuit which can reduce the voltage distortion rate of an output power.

2. Description of the Prior Art

Recently, many developments have been made to reduce the output voltage distortion rate of an amplifier circuit which controls the output power by a negative feedback. But still, none of the conventional amplifier circuit has accomplished to lower the output voltage distortion rate substantially to zero. This is especially difficult for an amplifier circuit which supplies electric power to a load, because the linearity of an output power characteristics will not be maintained when a great amount of electric current flows through the load. Thus, the output voltage distortion rate becomes poor.

FIG. 3 shows an example of a conventional amplifier circuit in which 1 is an input terminal; 2 is an output terminal; 10 is a preamplifier; 11 is a predriver transistor; 12 is an SEPP (single-ended push-pull) output stage; 9 is a negative feedback circuit for the negative feedback of the output voltage; and 13 is a phase compensation circuit.

The gain G of the amplifier circuit in this construction is shown as follows:

$$G = \frac{A_1 \cdot A_2}{1 + A_1 \cdot A_2 \cdot \beta}$$

where $A_1$ is the gain of the preamplifier, and $A_2$ is the gain of a circuit covering from predriver transistor 11 to SEPP output stage 1. $A_2$ can be expressed by the following equation:

$$A_2 = \frac{Z_p//Z_L \cdot h_{fe}}{r_e}, \quad Z_p//Z_L = \frac{Z_p \cdot Z_L}{Z_p + Z_L}$$

in which $r_e$ is the emitter resistance of predriver transistor; $Z_p$ is the impedance of phase compensation circuit 13; $h_{fe}$ is the current amplification of SEPP output stage 12; and $Z_L$ is the impedance of the load to be connected to output terminal 2.

The open-loop transfer characteristic of this construction is as follows:

$$A_1 \cdot A_2 \cdot \beta = \frac{K \cdot (1 + j\omega T_1)}{(1 + j\omega T_2)(1 + j\omega T_3)(1 + j\omega T_4)(1 + j\omega T_5)(1 + j\omega T_6)}$$

in which $T_1$ and $T_4$ are the time constants of negative feedback circuit 9; $T_2$ is the time constant of preamplifier 10; $T_3$ is the time constant determined by phase compensation circuit 13; and $T_5$ and $T_6$ are the time constants determined by SEPP output stage 12.

To maintain the stability of the feedback circuit, the parameters are determined as follows:

$T_1 > T_0$, $T_2 > T_0$, $T_3 > T_0$,
$T_4 > T_0$, $T_5 > T_0$, $T_6 > T_0$ provided that $T_0 = 1/\omega_0$, and $\omega_0$ is $\omega$ evaluated at $A_1 \cdot A_2 \cdot \beta = 1$.

According to the prior art amplifier circuit as described above, the electric current to be supplied to the load flows through the SEPP output stage. Also, the current amplification $h_{fe}$ of the SEPP output stage generally decreases when the electric current increases. Accordingly, the current amplification $h_{fe}$ varies with respect to the change of the output current. Thus, the gain $A_2$ becomes nonlinear, resulting in the electric power distortion.

Although it is preferable to make $\omega_0$ greater to improve the output voltage distortion by the negative feedback, $\omega_0$ can not be made greater than a certain level due to the increase of $T_5$ and $T_6$ in a region of high output current. Thus, the voltage distortion cannot be effectively improved by the negative feedback in the high frequency regions.

SUMMARY OF THE INVENTION

The present invention has been developed with a view to substantially solving the above described disadvantages and has for its essential object to provide an improved amplifier circuit in which the problem of nonlinear caused by the output current is solved, and at the same time, the voltage distortion rate by the negative feedback particularly in the high frequency regions is improved.

It is also an essential object of the present invention to provide an improved amplifier circuit of the above described type which has a simple structure.

In accomplishing these and other objects, an amplifier circuit according to the invention comprises a first amplifier connected to an input terminal, a second amplifier connected to the output of the first amplifier, an impedance circuit connected to the output of the first amplifier and to the output of the second amplifier, a feedback circuit connected to the impedance circuit and to said first amplifier, and an output terminal connected to the feedback circuit.

According to the improved amplifier circuit of the present invention, the output voltage at the output terminal is controlled by the output of the first amplifier by the negative feedback. When a load is connected to the output terminal, most or all of the electric current to the load is supplied from the output of the second amplifier. Thus, the first amplifier, which controls the output voltage of the output terminal, supplies less power to the load, thereby improving the linearity of the output power characteristics. Also, the negative feedback can be performed with a high stability even in the high frequency regions, thereby reducing the output voltage distortion at a very low rate.

BRIEF DESCRIPTION OF THE DRAWINGS

These and other objects and features of the present invention will become apparent from the following description taken in conjunction with preferred embodiments thereof with reference to the accompanying drawings, throughout which like parts are designated by like reference numerals, and in which.

DESCRIPTION OF THE PREFERRED EMBODIMENTS

Figure 1:
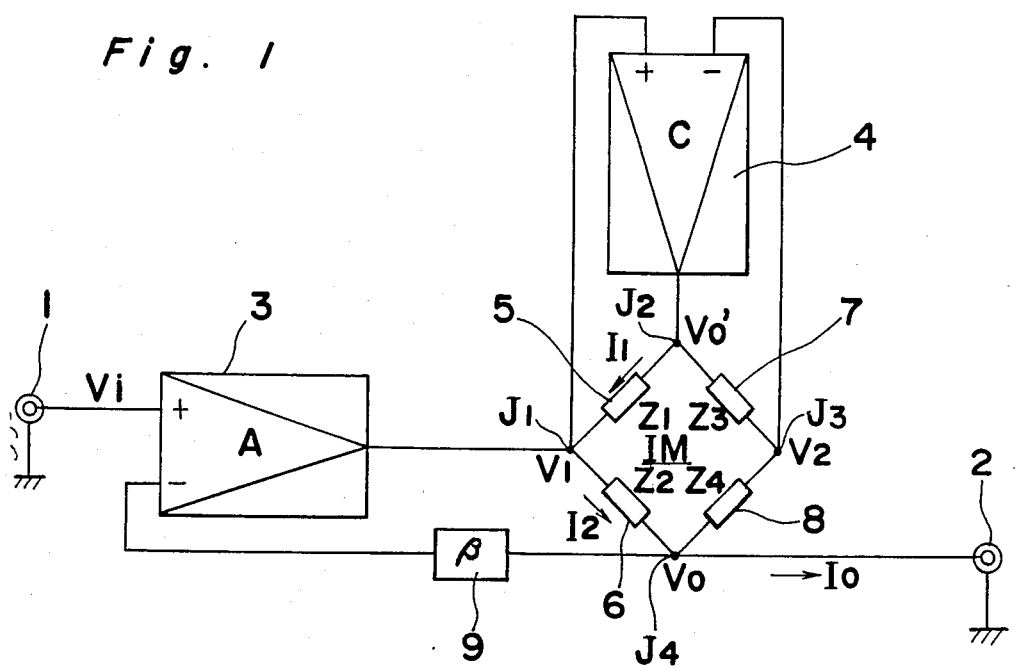
FIG. 1 is a circuit diagram showing an amplifier circuit according to a first embodiment of the present invention.

Referring to FIG. 1, an improved amplifier circuit according to a first embodiment of the present invention is shown. In the drawing, a reference number 1 designates an input terminal; 2 designates an output terminal; 3 designates a first amplifier; 4 designates a second amplifier; 5 designates a first impedance element; 6 designates a second impedance element; 7 designates a third impedance element; 8 designates a fourth impedance element; and 9 designates a feedback circuit. The four impedance elements 5, 6, 7, and 8 are connected in bridge so as to define an impedance circuit IM. A junction J1 between first and second impedance elements 5 and 6 is connected to the output of first amplifier 3 and also to the non-inverting input of the second amplifier 4. A junction J2 between first and third impedance elements 5 and 7 is connected to the output of second amplifier 4. A junction J3 between third and fourth impedance elements 7 and 8 is connected to the non-inverting input of second amplifier 4. A junction J4 between second and fourth impedance elements 6 and 8 is connected to the output terminal 2 and also to the non-inverting input of first amplifier 3 via negative feedback circuit 9. The non-inverting terminal of first amplifier 3 is connected to the input terminal 1.

In the amplifier circuit shown in FIG. 1, the output voltage $V_0$ produced from output terminal 2 can be given by:

$$V_0 = V_i \cdot A/(1 + A \cdot \beta)$$

in which $V_i$ is the voltage applied to input terminal 1, A is the gain of first amplifier 3, and $\beta$ is the gain of feedback circuit 9. In the above equation, if $A\beta \gg 1$, the equation can be expressed as:

$$V_0 \approx V_i/\beta$$

The above expression indicates that the output voltage of output terminal 2 can be determined by the ratio of the input voltage $V_i$ to the gain $\beta$ of feedback circuit 9.

When a load is connected to output terminal 2 to permit an electric current flow of $I_0$, the current $I_0$ is equal to the sum of a current $I_2$ flowing through second impedance element 6, a current flowing through fourth impedance element 8 and a current flowing through feedback circuit 9. If the current flowing through fourth impedance element 8 and the current flowing through feedback circuit 9 is much smaller than said $I_2$, the following equation is obtained:

$$I_0 \approx I_2$$

Thus, the output voltage $V_1$ from first amplifier 3 can be expressed as follows:

$$V_1 = I_2 \cdot Z_2 + V_0$$
$$\approx I_0 \cdot Z_2 + V_0$$

in which $Z_2$ is the impedance of second impedance element 6.

Also, the output voltage $V_0'$ of second amplifier 4 can be expressed as follows:

$$V_0' = (V_1 - V_2) \cdot C$$

in which C is the gain of second amplifier 4 and $V_2$ is the input voltage at the inverting input of second amplifier 4.

When the impedance of third impedance element 7 is expressed as $Z_3$, and the impedance of fourth impedance element 8 is expressed as $Z_4$, the following equation can be obtained:

$$V_2 = (V_0' - V_0) \cdot Z_4/(Z_3 + Z_4) + V_0$$

Thus, $$V_0' = \frac{\{V_1 - V_0 \cdot Z_3/(Z_3 + Z_4)\} \cdot C}{1 + C \cdot Z_4/(Z_3 + Z_4)}$$

is obtained. Here, if $1 < C \cdot Z_4/(Z_3 + Z_4)$ $$V_0' \approx \frac{V_1 - V_0 \cdot Z_3/(Z_3 + Z_4)}{Z_4/(Z_3 + Z_4)}$$

is obtained. Thus, when the impedance of first impedance element 5 is expressed as $Z_1$, the electric current $I_1$ which flows through first impedance element 5 can be expressed as follows:

$$I_1 = (V_0' - V_1)/Z_1 \approx (Z_2/Z_1) \cdot (Z_3/Z_4) \cdot I_0$$

If the impedance elements 5, 6, 7 and 8 are so arranged to satisfied the equation:

$$Z_2/Z_1 = Z_4/Z_3,$$

then the following relationship is obtained:

$$I_1 \approx I_0$$

This relationship indicates that the output current $I_0$ to be supplied to the load is mostly supplied from second amplifier 4.

Thus, the amplifier circuit according to the present invention an outstanding feature that the output voltage $V_0$ at output terminal 2 is controlled by the first amplifier 3, but the output current $I_0$ at output terminal 2 is controlled by the second amplifier 4, separately. Accordingly, the first amplifier may control the electric voltage at the output terminal, and the second amplifier may control the electric current at the output terminal separately. Thus, the linearity of the output power is improved, and a negative feedback can be performed with a high stability even in high frequency regions. Furthermore, the output voltage distortion is improved greatly. Thus, only a supply of small amount of bias current is needed to allow the first amplifier to function as the class A amplifier, hence an amplifier circuit having an excellent linearity resulting from a linear transmission gain is possible.

Figure 2:
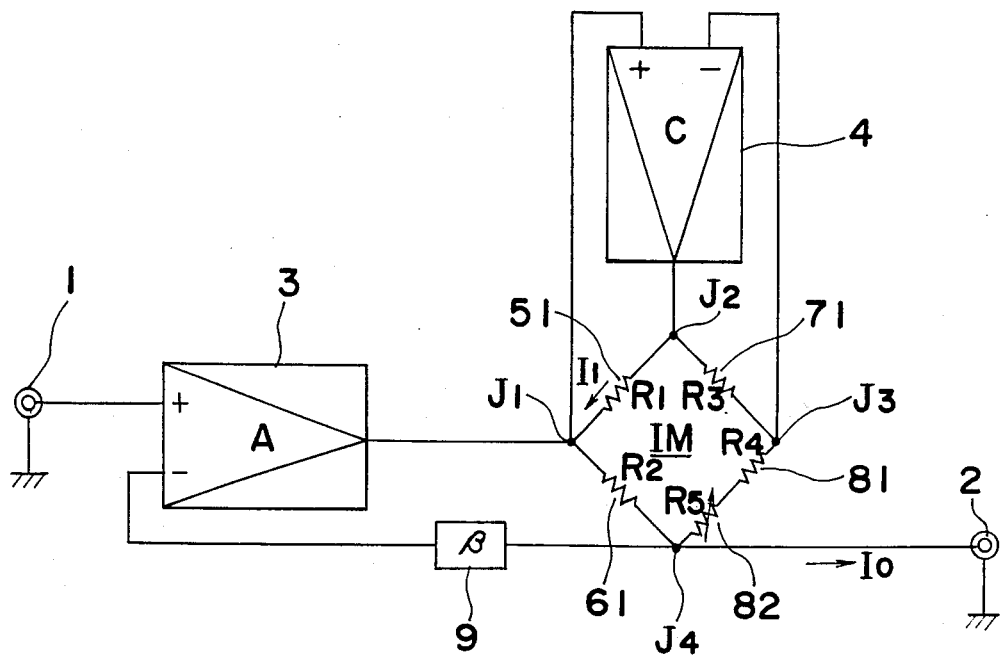
FIG. 2 is a circuit diagram showing an amplifier circuit according to a second embodiment of the present invention.
Figure 3:
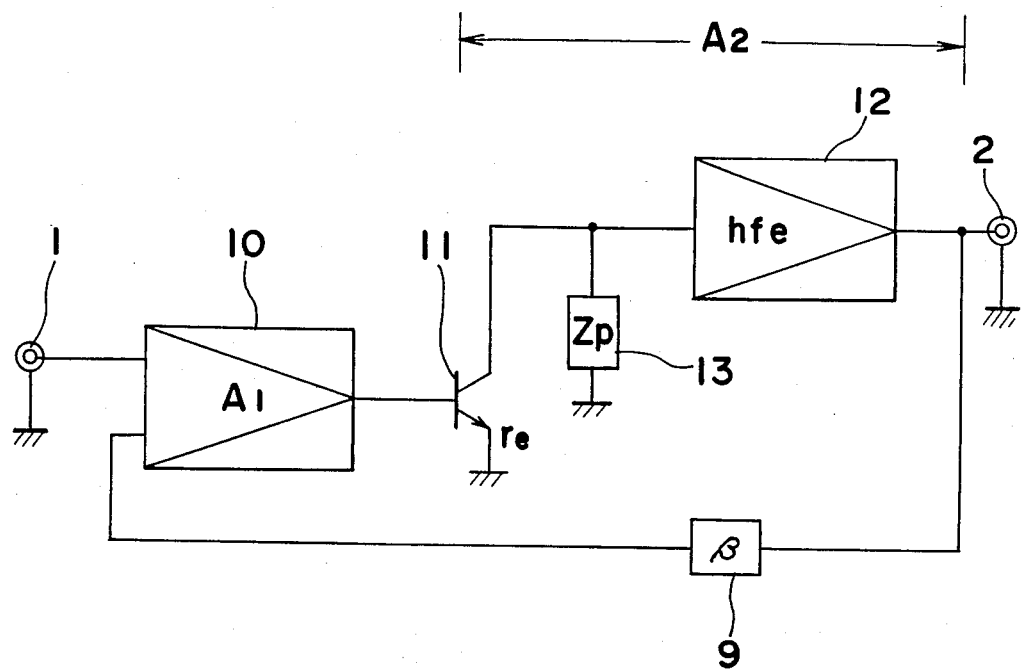
FIG. 3 is a circuit block diagram showing a prior art amplifier circuit.

FIG. 2 is a circuit diagram showing a second embodiment of the present invention. In FIG. 2, a modified impedance circuit IM is employed, in which reference numbers 51, 61, 71, and 81 designate resistors, and 82 designates a variable resistor for adjusting the impedance. The other parts of the second embodiment amplifier circuit are the same as those of the amplifier circuit of the first embodiment.

In the second embodiment, resistor 51 corresponds to the first impedance element 5 of embodiment 1. Similarly, resistor 61 corresponds to the second impedance element 6; resistor 71 corresponds to the third impedance element 7; and resistors 81 and 82 correspond to the fourth impedance element 8. When the resistances of resistors 51, 61, 71, 81 and 82 are $R_1$, $R_2$, $R_3$, $R_4$ and $R_5$, respectively, a relationship between the electric current $I_0$ to be supplied to the load and the electric current $I_1$ which flows through resistor 51 can be expressed as follows:

$$I_1 = \frac{R_2}{R_1} \cdot \frac{R_3}{(R_4 + R_5)} \cdot I_0$$

If the bridge circuit is so arranged to satisfy:

$$R_2/R_1 = R_3/(R_4+R_5)$$

by adjusting variable resistor 82, the the above relationship can be expressed as follows:

$$I_1 \approx I_0$$

It is to be noted that the bridge circuit does not have to satisfy the condition $R_2/R_1 = R_3/(R_4+R_5)$ in all frequencies, but only in a limited frequency range, such as between 20 Hz and 20 kHz.

As described above, by adjusting the variable resistor, it is possible to further precisely adjust the the output current from the second amplifier to be the same as the current to be supplied to the load. Thus, the current from the first amplifier to the load can be further reduced.

According to the amplifier circuit of the present invention, a current to be supplied to the load from the first amplifier is reduced, thereby improving the linearity of the output power. Further, the negative feedback performs with a high stability, thereby improving the output voltage distortion.

Although the present invention has been fully described with reference to several preferred embodiments, many modifications and variations thereof will now be apparent to those skilled in the art, and the scope of the present invention is therefore to be limited not by the details of the preferred embodiments described above, but only by the terms of the appended claims.

What is claimed is:

1. An amplifier circuit comprising:
   an input terminal;
   a first amplifier having an inverting input and a non-inverting input, said non-inverting input being connected to said input terminal;
   a second amplifier having an inverting input and a non-inverting input, said non-inverting input of said second amplifier being connected to an output of said first amplifier;
   an impedance circuit defined by first, second, third and fourth impedance elements connected in a bridge circuit,
   a first function between said first impedance element and second impedance element being connected to an output of said first amplifier;
   a second junction between said first impedance element and said third impedance element being connected to an output of said second amplifier;
   a third function between said third impedance element and said fourth impedance element being connected to said inverting input of said second amplifier;
   a fourth junction between said second impedance element and said fourth impedance element;
   a negative feedback circuit connected between said fourth junction and said inverting input of said first amplifier;
   an output terminal connected to said fourth junction; and
   a load connected between said output terminal and ground.

2. An amplifier circuit as claimed in claim 1, wherein at least one of said first, second, third and fourth impedance elements comprises a resistor.

3. An amplifier circuit as claimed in claim 1, wherein a first impedance ratio of the first impedance element to the second impedance element is equal to a second impedance ratio of the third impedance element to the fourth impedance element.

4. An amplifier circuit as claimed in claim 3, wherein said equity between the first and second impedance ratios is obtained in a specific frequency region.

5. An amplifier circuit as claimed in claim 1, wherein at least one of said first, second, third and fourth impedance elements comprises a variable resistor.

6. An amplifier circuit as claimed in claim 1, wherein said first amplifier is a class A amplifier.

* * * * *